United States Patent [19]
Hofhine et al.

[11] Patent Number: 5,982,246
[45] Date of Patent: Nov. 9, 1999

[54] CRYSTAL OSCILLATOR HAVING PRESTRESSING BIAS CIRCUIT TO PROVIDE FAST START-UP

[75] Inventors: Paul H. Hofhine, Mesa; Louis A. Prado, Tempe, both of Ariz.

[73] Assignee: Microchip Technology Incorporated, Chandler, Ariz.

[21] Appl. No.: 09/056,122

[22] Filed: Apr. 6, 1998

[51] Int. Cl.⁶ .............................. H03B 5/36; H03L 3/00
[52] U.S. Cl. ................................ 331/116 FE; 331/158
[58] Field of Search ...................... 331/116 R, 116 FE, 331/158

[56] References Cited

U.S. PATENT DOCUMENTS

| | | | |
|---|---|---|---|
| 4,704,587 | 11/1987 | Ouyang et al. | 331/116 FE |
| 4,956,618 | 9/1990 | Ulmer | 331/116 FE |
| 5,805,027 | 9/1998 | Yin | 331/116 FE |

Primary Examiner—Siegfried H. Grimm
Attorney, Agent, or Firm—Harry M. Weiss; Jeffrey Weiss; Paul W. Davis

[57] ABSTRACT

A fast start-up oscillator has an oscillator for generating a signal having a desired frequency. A prestress biasing circuit is coupled to the oscillator. The prestress biasing circuit is used for prestressing a piezoelectric resonator of the oscillator and for placing a bias voltage on the oscillator after the piezoelectric resonator of the oscillator has been prestressed.

40 Claims, 1 Drawing Sheet

CRYSTAL OSCILLATOR HAVING PRESTRESSING BIAS CIRCUIT TO PROVIDE FAST START-UP

BACKGROUND OF THE INVENTION

1. Field of the Invention

This invention relates generally to oscillators and, more specifically, to a fast start-up piezoelectric resonator based oscillator which uses a circuit which will prestress the piezoelectric resonator and which will bias the oscillator into a linear operating region after the piezoelectric resonator has been prestressed.

2. Description of the Prior Art

The start-up time of an oscillator is defined as the time required for the oscillator to reach a steady state. Presently, for most oscillators, the start-up time can be several seconds depending on the crystal frequency and amplifier design of the oscillator. The start-up time may be even longer when the temperature of the device using the oscillator increases. This creates the problem since the start-up times may be fairly long and unpredictable.

Therefore, a need existed to provide an improved oscillator. The improved oscillator must have faster start-up times than present oscillators. The improved oscillator must further have faster and more predictable start-up times even though operating conditions may fluctuate and change.

SUMMARY OF THE INVENTION

In accordance with one embodiment of the present invention, it is an object of the present invention to provide an improved oscillator.

It is another object of the present invention to provide an improved oscillator that has faster start-up times than present oscillators.

It is still another object of the present invention to provide an improved oscillator that has faster and more predictable start-up times even though operating conditions of the improved oscillator may fluctuate and change.

BRIEF DESCRIPTION OF THE PREFERRED EMBODIMENTS

In accordance with one embodiment of the present invention, a fast start-up oscillator is disclosed. The fast start-up oscillator uses an oscillator for generating a signal having a desired frequency. A prestress biasing circuit is coupled to the oscillator. The prestress biasing circuit is used for prestressing a piezoelectric resonator of the oscillator and for placing a bias voltage on the oscillator after the piezoelectric resonator of the oscillator has been prestressed.

In accordance with another embodiment of the present invention, a method for quick start-up of an oscillator is disclosed. The method comprises the steps of: providing an oscillator circuit for generating a signal having a desired frequency; providing a prestress biasing circuit coupled to the oscillator circuit for prestressing a piezoelectric resonator of the oscillator circuit and for placing a bias voltage on the oscillator circuit after the piezoelectric resonator of the oscillator circuit is prestressed; prestressing the piezoelectric resonator of the oscillator circuit; applying a bias voltage on the oscillator circuit for placing the oscillator circuit into a linear operation region after the piezoelectric resonator is prestressed; and removing the bias voltage.

The foregoing and other objects, features, and advantages of the invention will be apparent from the following, more particular, description of the preferred embodiments of the invention, as illustrated in the accompanying drawings.

DETAILED DESCRIPTION OF THE PREFERRED EMBODIMENTS

Figure 1:
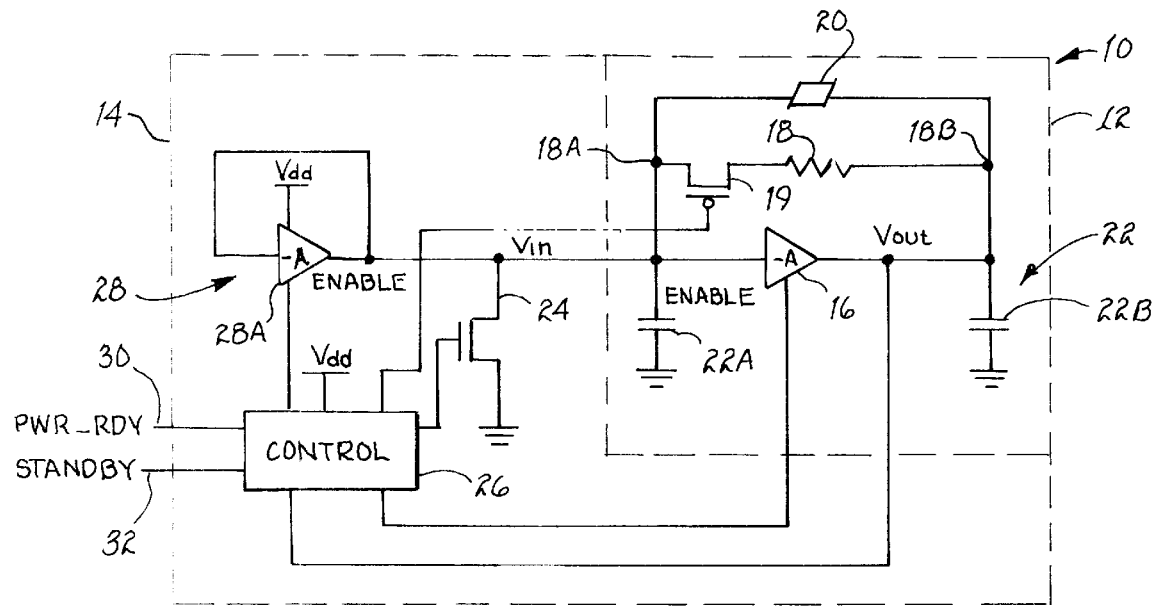
FIG. 1 is a simplified functional block diagram of the oscillator of the present invention.

Referring to FIG. 1, an oscillator 10 is shown which has faster start-up times than present oscillators. The oscillator 10 has two main components: an oscillator circuit 12 and a prestress biasing circuit 14. The oscillator circuit 12 is used for generating a signal of a desired frequency. In the preferred embodiment of the present invention, the oscillator circuit 12 is a piezoelectric resonator based oscillator.

As can be seen in FIG. 1, the oscillator circuit 12 uses an amplifier 16. In the preferred embodiment of the present invention, the amplifier 16 is an inverting amplifier. A resistive element 18 is coupled to the inverting amplifier 16. The resistive element 18 has a first terminal 18A which is coupled to an input of the amplifier 16 and a second terminal 18B which is coupled to an output of the amplifier 16. The resistive element 18 is used to bias the operation of the inverting amplifier 16 into a linear operating region. A transistor 19 may be coupled between the input of the amplifier 16 and the resistive element 18. The transistor would be a three terminal transistor having a first terminal coupled to the resistive element 18, a second terminal coupled to a control circuit 26, and a third terminal coupled to the input of the amplifier 16. The transistor 19 is used to activate and deactivate the resistor 18. Thus, the transistor 19 is used as a switch to reduce the power consumption during a standby mode of operation. In the preferred embodiment of the present invention, the transistor 19 is a Metal Oxide Semiconductor Field Effect Transistor (MOSFET), and more specifically, a P-channel MOSFET. A piezoelectric resonator 20 is also coupled to the input and to the output of the inverting amplifier 16. The piezoelectric resonator 20 may be a crystal resonator or a ceramic resonator. The piezoelectric resonator 20 is used to control the frequency of oscillation of the oscillator circuit 12. The oscillator circuit 12 has a pair of capacitive elements 22. A first capacitive element 22A has a first terminal which is coupled to the input of the amplifier 16 and a second terminal which is coupled to ground. A second capacitive element 22B has a first terminal which is coupled to the output of the amplifier 16 and a second terminal which is coupled to ground. The pair of capacitive elements 22 are used for adjusting the gain of the amplifier 16.

When power is first applied to most oscillators, it generally takes several seconds for the oscillator to reach a steady state of oscillation. For this reason, a prestress biasing circuit 14 is coupled to the oscillator circuit 12. The prestress biasing circuit 14 is used for prestressing the piezoelectric resonator 20 of the oscillator circuit 12 and for placing a bias voltage on the oscillator circuit 12 after the piezoelectric resonator 20 of the oscillator circuit 12 is prestressed.

The prestress biasing circuit 14 has a transistor 24. The transistor 24 has a first terminal which is coupled to the input of the amplifier 16, a second terminal which is coupled to the control circuit 26, and a third terminal which is coupled to ground. In the preferred embodiment of the present invention, the transistor 24 is a Metal Oxide Semiconductor Field Effect Transistor (MOSFET), and more specifically, an N-channel MOSFET. The transistor 24 is used for holding the input of the oscillator circuit 12 at ground when the oscillator circuit 12 needs to start. Since the amplifier 16 is an inverting amplifier, the output of the amplifier 16 is at a high level (i.e., $V_{dd}$). Since the piezoelectric resonator 20 is also coupled to the input and the output of the amplifier 16, one terminal of the piezoelectric resonator 20 is at ground while the other terminal of the piezoelectric resonator 20 is at $V_{dd}$. Thus, an applied voltage is applied across the piezoelectric resonator 20. The piezoelectric resonator 20 is now stressed and ready to oscillate.

Under the prestressed conditions, the amplifier 16 is not a linear amplifier. The amplifier 16 is a saturated amplifier. If the holding of the input of the oscillator circuit 12 at ground by the transistor 24 is released, by the time the capacitive element 22B discharges through the resistive element 18 to bring the amplifier 16 into a linear operating region, the stress condition on the piezoelectric resonator 20 is lost. Thus, the oscillator 10 will not start-up. For this reason, a bias device 28 is coupled to the input of the amplifier 16. The biasing device 28 is used for applying a voltage on the input of the oscillator circuit 12 to bias the oscillator circuit 12 into a linear operation region after the piezoelectric resonator 20 is prestressed and the holding of the input of the oscillator circuit 12 at ground by the transistor 24 is released. In the embodiment depicted in FIG. 1, the biasing device 28 is an amplifier 28A. The amplifier 28A has an output coupled to the input of the oscillator circuit 12, an input coupled to the output of the amplifier 28A, and an enable input coupled to the control circuit 26.

The biasing device 28 will drive the input of the oscillator to a voltage level of approximately $V_{dd}/2$. When this voltage is reached, the driving voltage is disconnected from the input of the amplifier 16 of the oscillator circuit 12 and is left as a high impedance. The oscillator circuit 12 now has a stressed piezoelectric resonator 20 which is ready to vibrate and a biased amplifier 16 which is ready to respond to the vibrations.

The prestress biasing circuit 14 has a control circuit 26. The control circuit 26 has a first input coupled to a first signal line 30 (PWR_RDY). The first signal line 30 indicates, as power is applied, when a stable level is achieved and oscillation should begin. The control circuit 14 has a second input coupled to a second signal line 32 (STANDBY). The second signal line 32 indicates when the oscillator circuit 12 should not operate (i.e., sleep mode). The oscillator circuit 12 should begin to oscillate when the signal from the second signal line 32 has ended. The control circuit 26 further has a third input coupled to an output of the amplifier 16 of the oscillator circuit 12. The control circuit 26 has an output coupled to an enable input of the amplifier 16, the transistor 19, the transistor 24, and the amplifier 28A. The control circuit 26 is used for activating and deactivating the oscillator circuit 12, the transistor 19, the transistor 24, and the biasing device 28 in the proper sequence to achieve a fast start-up of the oscillator circuit 12.

Figure 2:
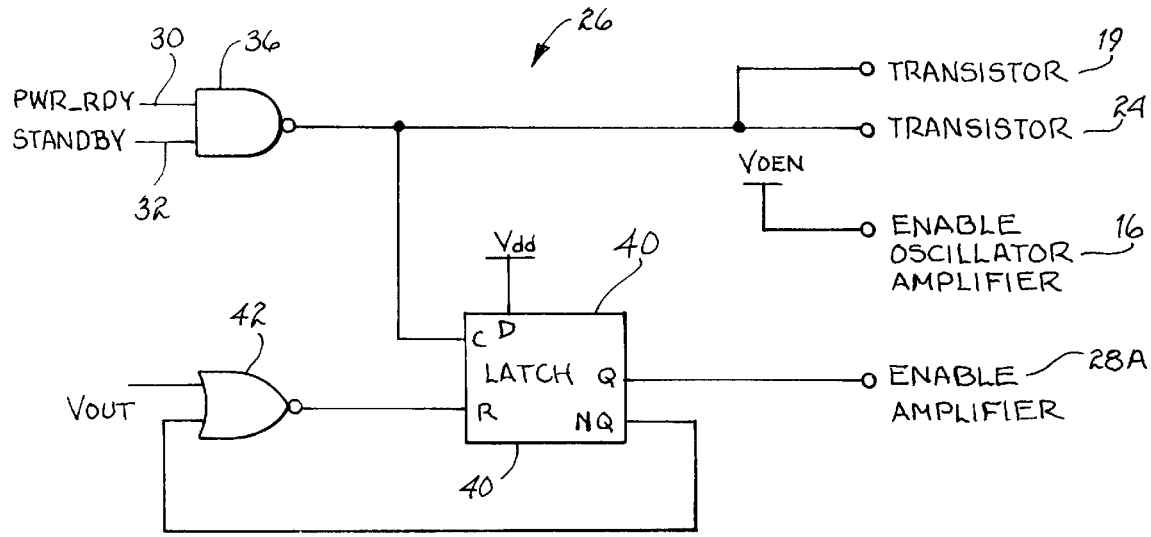
FIG. 2 is a simplified functional block diagram of the control circuit used in the oscillator depicted in FIG. 1.

Referring now to FIG. 2 wherein like numerals and symbols represent like elements, the control circuit 26 is shown in more detail. The control circuit 26 has a first logic gate 36 which has a first input coupled to the first signal line 30, a second input coupled to the second signal line 32, and an output which is coupled to the transistor 19 and to the transistor 24. The first logic gate 36 is used to activate and deactivate both the transistor 19 and the transistor 24 based on the inputs from the first signal line 30 and the second signal line 32. In the preferred embodiment of the present invention, the first logic gate 36 is a NAND gate and will activate the transistor 19 and deactivate the transistor 24 when the signals from the first signal line 30 is high and the second signal line 32 is low.

The control circuit 26 has a voltage source $V_{oen}$. The voltage source $V_{oen}$ is coupled to the enable input of the amplifier 16 of the oscillator circuit 12. The voltage source $V_{oen}$ is used to activate and deactivate the amplifier 16 which in turn activates and deactivates the oscillator circuit 12. In the preferred embodiment of the present invention, the voltage source $V_{oen}$ is always active. Thus, in the preferred embodiment of the present invention, the amplifier 16 is always activated.

The control circuit 26 further uses a latch 40. The latch 40 has a first input coupled to a voltage source $V_{dd}$. A second input of the latch 40 is coupled to the output of the first logic gate 36, a third input of the latch 40 is coupled to the output of a logic gate 42. In the preferred embodiment of the present invention, the logic gate 42 is a NOR gate having a first input coupled to the output of the amplifier 16 and a second input coupled to the inverted output of the latch 40. The latch 40 is used to activate and deactivate the amplifier 28A.

OPERATION

Referring now to FIG. 1 and 2, the operation of the oscillator 10 will be described. In the preferred embodiment of the present invention, the voltage source $V_{oen}$ is always active. Thus, the amplifier 16 is always active. When the output of the NAND gate 36 goes low, the control circuit 26 will cause the transistor 19 to be deactivated and the transistor 24 will be enabled. Once activated, the transistor 24 will pull the input of the amplifier 16 towards ground potential. An applied voltage is now applied across the piezoelectric resonator 20. The piezoelectric resonator 20 is now stressed and ready to oscillate. During this time, the biasing device 28 is in a high impedance mode and the transistor 19 is off (i.e., feedback is in a high impedance state.

At the end of the prestress period, the control circuit 26 will turn off the transistor 24, thus activating the transistor 19, and will enable the biasing device 28 and the feedback. The biasing device 28 provides a bias voltage to the input of the amplifier 16 of the oscillator circuit 12 causing the output of the amplifier 16 to be driven to the value of the bias voltage. When the output of the amplifier 16 reaches the bias voltage, the control circuit 26 will deactivate the biasing device 28.

The transistor 24 and the biasing device 28 are now both deactivated and in a high impedance state. The amplifier 16 is at a linear operating point and the crystal is vibrating from the effects of the prestress. Full amplitude oscillation can now be quickly achieved.

While the invention has been particularly shown and described with reference to preferred embodiments thereof, it will be understood by those skilled in the art that the foregoing and other changes in form, and details may be made therein without departing from the spirit and scope of the invention.

What is claimed is:

1. An oscillator comprising, in combination:
   an oscillator circuit for generating a signal having a desired frequency; and
   a prestress biasing circuit coupled to said oscillator circuit for prestressing a piezoelectric resonator of said oscillator circuit and for placing a bias voltage on said oscillator circuit after said piezoelectric resonator of said oscillator circuit is prestressed.

2. An oscillator in accordance with claim 1 wherein said prestress biasing circuit comprises:
   a transistor coupled to an input of said oscillator circuit for holding said input of said oscillator circuit at ground when said oscillator circuit needs to start;
   a biasing device coupled to said input of said oscillator circuit for applying a voltage on said input of said oscillator circuit to place said oscillator circuit into a linear operation region after said piezoelectric resonator is prestressed; and
   a control circuit for activating and deactivating said oscillator circuit, said transistor, and said biasing device.

3. An oscillator in accordance with claim 2 wherein said transistor is a Metal Oxide Semiconductor Field Effect Transistor (MOSFET).

4. An oscillator in accordance with claim 3 wherein said MOSFET is an N-channel MOSFET.

5. An oscillator in accordance with claim 2 wherein said biasing device is an amplifier having an output coupled to said input of said oscillator circuit, an input coupled to said output of said amplifier, and an enable input coupled to said control circuit.

6. An oscillator in accordance with claim 2 wherein said control circuit has a first input coupled to a first signal which indicates when said oscillator circuit has reached a stable level and oscillation is to start, a second input coupled to a second signal which indicates when said oscillator circuit should not operate, and a third input coupled to an output of said oscillator.

7. An oscillator in accordance with claim 6 wherein said control circuit comprises:
   a first logic gate having a first input coupled to said first signal which indicates when said oscillator circuit has reached a stable level and oscillation is to start, a second input coupled to said second signal which indicates when said oscillator circuit should not operate, and an output coupled to said transistor;
   a power enable source coupled to said oscillator circuit for activating and deactivating said oscillator circuit;
   a latch having a first input coupled to a voltage source, a second input coupled to said output of said first logic gate, and an output coupled to said oscillator circuit; and
   a second logic gate having a first input coupled to said output of said oscillator circuit, a second input coupled to an inverted output of said latch, and an output coupled to a third input of said latch.

8. An oscillator in accordance with claim 7 wherein said first logic gate is a NAND gate.

9. An oscillator in accordance with claim 7 wherein said second logic gate is a NOR gate.

10. An oscillator in accordance with claim 2 wherein said oscillator circuit comprises:
    an amplifier;
    a resistor having a first terminal coupled to an input of said amplifier and a second terminal coupled to an output of said amplifier for biasing said amplifier into a linear operation region;
    a piezoelectric resonator having a first terminal coupled to said input of said amplifier and a second terminal coupled to said output of said amplifier for setting a frequency of oscillation; and
    a pair of capacitive elements wherein a first capacitive element is coupled to said input of said amplifier and a second capacitive element is coupled to said output of said amplifier for adjusting a gain of said amplifier.

11. An oscillator in accordance with claim 10 wherein said piezoelectric resonator is a crystal resonator.

12. An oscillator in accordance with claim 10 wherein said piezoelectric resonator is a ceramic resonator.

13. An oscillator in accordance with claim 10 wherein said amplifier is an inverting amplifier.

14. An oscillator in accordance with claim 11 wherein said oscillator circuit further comprises a switch coupled to said resistor and to said input of said amplifier for activating and deactivating said resistor.

15. An oscillator in accordance with claim 14 wherein said switch is a transistor.

16. An oscillator in accordance with claim 15 wherein said transistor is a P-channel Metal Oxide Semiconductor Field Effect Transistor (MOSFET).

17. An oscillator in accordance with claim 14 wherein said control circuit is used for activating and deactivating said switch.

18. An oscillator comprising, in combination:
    an oscillator circuit for generating a signal having a desired frequency, wherein said oscillator comprises:
       an amplifier wherein said amplifier is an inverting amplifier;
       a resistor having a first terminal coupled to an input of said amplifier and a second terminal coupled to an output of said amplifier for biasing said amplifier into a linear operation region;
       a piezoelectric resonator having a first terminal coupled to said input of said amplifier and a second terminal coupled to said output of said amplifier for setting a frequency of oscillation; and
       a pair of capacitive elements wherein a first capacitive element is coupled to said input of said amplifier and a second capacitive element is coupled to said output of said amplifier for adjusting a gain of said amplifier; and
       a switch coupled to said resistor and to said input of said amplifier for activating and deactivating said resistor; and
    a prestress biasing circuit coupled to said oscillator circuit for prestressing said piezoelectric resonator of said oscillator circuit and for placing a bias voltage on said oscillator circuit after said piezoelectric resonator of said oscillator circuit is prestressed, said prestressing biasing circuit comprising:
       a transistor coupled to an input of said oscillator circuit for holding said input of said oscillator circuit at ground when said oscillator circuit needs to start;
       a biasing device coupled to said input of said oscillator circuit for applying a voltage on said input of said oscillator circuit to place said oscillator circuit into said linear operation region after said piezoelectric resonator is prestressed; and
       a control circuit for activating and deactivating said oscillator circuit, said switch, said transistor, and said biasing device.

19. An oscillator in accordance with claim 18 wherein said transistor is a Metal Oxide Semiconductor Field Effect Transistor (MOSFET).

20. An oscillator in accordance with claim 19 wherein said MOSFET is an N-channel MOSFET.

21. An oscillator in accordance with claim 18 wherein said biasing device is an amplifier having an output coupled to said input of said oscillator circuit, an input coupled to said output of said amplifier, and an enable input coupled to said control circuit.

22. An oscillator in accordance with claim 18 wherein said control circuit has a first input coupled to a first signal which indicates when said oscillator circuit has reached a stable level and oscillation is to start, a second input coupled to a second signal which indicates when said oscillator circuit should not operate, and a third input coupled to an output of said oscillator.

23. An oscillator in accordance with claim 22 wherein said control circuit comprises:

a first logic gate having a first input coupled to said first signal which indicates when said oscillator circuit has reached a stable level and oscillation is to start, a second input coupled to said second signal which indicates when said oscillator circuit should not operate, and an output coupled to said transistor and to said switch;

a power enable source coupled to said oscillator circuit for activating and deactivating said oscillator circuit;

a latch having a first input coupled to a voltage source, a second input coupled to said output of said first logic gate, and an output coupled to said oscillator circuit; and a second logic gate having a first input coupled to said output of said oscillator circuit, a second input coupled to an inverted output of said latch, and an output coupled to a third input of said latch.

24. An oscillator in accordance with claim 23 wherein said first logic gate is a NAND gate.

25. An oscillator in accordance with claim 23 wherein said second logic gate is a NOR gate.

26. An oscillator in accordance with claim 18 wherein said piezoelectric resonator is one of a crystal resonator or ceramic resonator.

27. An oscillator in accordance with claim 18 wherein said switch is a P-channel Metal Oxide Semiconductor Field Effect Transistor (MOSFET).

28. A method for quick start-up of an oscillator comprising the steps of:

providing an oscillator circuit for generating a signal having a desired frequency;

providing a prestress biasing circuit coupled to said oscillator circuit for prestressing a crystal of said oscillator circuit and for placing a voltage on said oscillator circuit after said crystal of said oscillator circuit is prestressed;

prestressing said crystal of said oscillator circuit;

applying a voltage on said oscillator circuit for placing said oscillator circuit into a linear operation region after said crystal is prestressed; and removing said voltage.

29. The method of claim 28 wherein said step of providing a prestress biasing circuit further comprises the steps of providing a transistor coupled to an input of said oscillator circuit for holding said input of said oscillator circuit at ground when said oscillator circuit needs to start.

30. The method of claim 29 wherein said step of providing a transistor further comprises the step of providing an N-channel Metal Oxide Semiconductor Field Effect Transistor (MOSFET).

31. The method of claim 29 wherein said step of providing a prestress biasing circuit further comprises the step of providing a biasing device coupled to said input of said oscillator circuit for applying said voltage on said input of said oscillator circuit to place said oscillator circuit into said linear operation region after said crystal is prestressed.

32. The method of claim 31 wherein said step of providing a biasing device further comprises the step of providing an amplifier having an output coupled to said input of said oscillator circuit, an input coupled to said output of said amplifier.

33. The method of claim 31 wherein said step of providing a prestress biasing circuit further comprising step of providing a control circuit for activating and deactivating said oscillator circuit, said transistor, and said biasing device.

34. The method of claim 33 wherein said step of providing a control circuit further comprises the steps of:

providing a first logic gate having a first input coupled to a first signal which indicates when said oscillator circuit has reached a stable level and oscillation is to start, a second input coupled to a second signal which indicates when said oscillator circuit should not operate, and an output coupled to said transistor;

providing a power enable source coupled to said oscillator circuit for activating and deactivating said oscillator circuit;

providing a latch having a first input coupled to a voltage source, a second input coupled to said output of said first logic gate, and an output coupled to said oscillator circuit; and providing a second logic gate having a first input coupled to said output of said oscillator circuit, a second input coupled to an inverted output of said latch, and an output coupled to a third input of said latch.

35. The method of claim 34 wherein said step of providing a first logic gate further comprises the step of providing a NAND gate.

36. The method of claim 34 wherein said step of providing a second logic gate further comprises the step of providing a NOR gate.

37. The method of claim 28 wherein said step of providing an oscillator circuit further comprises the steps of:

providing an amplifier wherein said amplifier is an inverting amplifier;

providing a resistor having a first terminal coupled to an input of said amplifier and a second terminal coupled to an output of said amplifier for biasing said amplifier into a linear operation region;

providing a switch coupled to said resistor and to said input of said amplifier for activating and deactivating said resistor;

providing a piezoelectric resonator having a first terminal coupled to said input of said amplifier and a second terminal coupled to said output of said amplifier for setting a frequency of oscillation; and providing a pair of capacitive elements wherein a first capacitive element is coupled to said input of said amplifier and a second capacitive element is coupled to said output of said amplifier for adjusting a gain of said amplifier.

38. The method of claim 37 wherein said piezoelectric resonator is one of a crystal resonator or ceramic resonator.

39. The method of claim 37 wherein said switch is a P-channel Metal Oxide Semiconductor Field Effect Transistor (MOSFET).

40. The method of 37 wherein a control circuit is further used to activate and deactivate said switch.

\* \* \* \* \*